United States Patent
Pan et al.

(10) Patent No.: US 9,837,206 B1
(45) Date of Patent: Dec. 5, 2017

(54) ELECTRONIC DEVICE PACKAGING BOX

(71) Applicant: BOTHHAND ENTERPRISE INC., Tainan (TW)

(72) Inventors: Yung-Ming Pan, Taoyuan (TW); Chung-Cheng Fan, Taoyaun (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 0 days.

(21) Appl. No.: 15/384,737

(22) Filed: Dec. 20, 2016

(30) Foreign Application Priority Data

Aug. 15, 2016 (TW) .............................. 105125930 A

(51) Int. Cl.
| | |
|---|---|
| H05K 5/00 | (2006.01) |
| H01F 38/14 | (2006.01) |
| H05K 5/02 | (2006.01) |
| H05K 7/14 | (2006.01) |
| H01F 27/02 | (2006.01) |

(52) U.S. Cl.
CPC ............ *H01F 38/14* (2013.01); *H01F 27/027* (2013.01); *H05K 5/0091* (2013.01); *H05K 5/0247* (2013.01); *H05K 7/1427* (2013.01)

(58) Field of Classification Search
CPC .............................. H01F 27/027; H05K 5/0091
See application file for complete search history.

(56) References Cited

U.S. PATENT DOCUMENTS

| | | | | |
|---|---|---|---|---|
| 7,236,075 B1* | 6/2007 | Liu | ........................ | H01F 27/027 336/90 |
| 2006/0209521 A1* | 9/2006 | Li | ........................... | H05K 1/141 361/782 |
| 2007/0052510 A1* | 3/2007 | Saegusa | ................ | H01F 27/022 336/92 |
| 2007/0194875 A1* | 8/2007 | Wang | ..................... | H01F 27/027 336/199 |
| 2007/0262442 A1* | 11/2007 | Chen | ..................... | H01F 27/027 257/706 |
| 2007/0285200 A1* | 12/2007 | Hsieh | ..................... | H01F 27/027 336/83 |
| 2008/0232078 A1* | 9/2008 | Zhang | .................... | H01F 27/027 361/809 |
| 2008/0297294 A1* | 12/2008 | Wang | ..................... | H01F 27/027 336/90 |
| 2010/0134228 A1* | 6/2010 | Chow | .................... | H01F 27/027 336/92 |
| 2010/0142173 A1* | 6/2010 | Chen | ..................... | H01F 17/062 361/811 |

(Continued)

*Primary Examiner* — Hung V Ngo
(74) *Attorney, Agent, or Firm* — Burris Law, PLLC

(57) ABSTRACT

An electronic device packaging box includes a base and a terminal unit. The base includes a first space having a first opening and receiving a first coil, and second space having a second opening opposite to the first opening and receiving a second coil. The base has first and third side surfaces proximate to the first opening, and second and fourth side surfaces proximate to the second opening. The terminal unit has two first connecting sections protruding from the second side surface, two second connecting sections protruding from the third side surface, two first wire connecting sections protruding from the first side surface, and two second wire connecting sections protruding from the fourth side surface.

8 Claims, 8 Drawing Sheets

(56) References Cited

U.S. PATENT DOCUMENTS

| | | | |
|---|---|---|---|
| 2011/0095847 A1* | 4/2011 | Chen .................... | H01F 17/062 333/175 |
| 2012/0032766 A1* | 2/2012 | Liang .................... | H01F 17/062 336/90 |
| 2017/0034933 A1* | 2/2017 | Pan ..................... | H05K 5/0091 |

* cited by examiner

ELECTRONIC DEVICE PACKAGING BOX

CROSS-REFERENCE TO RELATED APPLICATION

This application claims priority of Taiwanese Patent Application No. 105125930, filed on Aug. 15, 2016.

FIELD

The disclosure relates to an electronic device packaging box.

BACKGROUND

Referring to FIGS. 1 to 3, a conventional electronic apparatus includes a packaging box 10 and at least one electronic unit 11 that is mounted to the packaging box 10 and that is electrically connected to the packaging box 10.

The electronic unit 11 includes a first electronic unit 111 and a second electronic unit 112. The first electronic unit 111 includes a first winding core 113, and two first connecting wires 114 that are wound on the first winding core 113. Each of the first connecting wires 114 has two wiring sections 115. Each of the wiring sections 115 of each of the first connecting wires 114 has a first connecting end 1151 and a second connecting end 1152. The second electronic unit 112 includes a second winding core 116, and two second conducting wires 117 that are wound on the second winding core 116. Each of the second conducting wires 117 has a first connecting end 118 and a second connecting end 119.

The packaging box 10 includes a base 12, and at least one terminal unit 13 that is mounted to the base 12. The number of the terminal unit 13 is the same as that of the electronic unit 11. Both numbers are usually plural in practical use. The base 12 includes a bottom wall 121, an outer surrounding wall 122 that extends upwardly from a periphery of the bottom wall 121, and a receiving space 123 that is defined by the bottom wall 121 and the outer surrounding wall 122 and that receives the electronic unit 11. The outer surrounding wall 122 has a first surface 124 and a second surface 125 that are respectively located at two opposite sides of the receiving space 123. The terminal unit 13 includes two first terminals 131 that protrude from the first surface 124 of the base 12 and that are spaced apart from each other, two second terminals 125 that protrude from the second surface 125 of the base 12 and that are spaced apart from each other, two grounding terminals 133, 134 that respectively protrude from the first surface 124 and the second surface 125, and two connecting terminals 135 that protrude from the second surface 125 and that are spaced apart from each other.

During assembly, the electronic unit 11 is placed into the receiving space 123. Subsequently, the first connecting ends 1151 of the wiring sections 115 of one of the first conducting wires 114 are respectively connected to the first terminals 131, and the second connecting ends 1152 of the wiring sections 115 of the one of the first conducting wires 114 are entwined together and connected to the grounding terminal 133. Moreover, the first connecting ends 1151 of the wiring sections 115 of the other one of the first conducting wires 114 are respectively entwined with the first connecting ends 118 of the second conducting wires 117, and the second connecting ends 1152 of the wiring sections 115 of the other one of the first conducting wires 114 are entwined together and connected to the grounding terminal 134. The second connecting ends 119 of the second conducting wires 117 are respectively connected to the second terminals 132.

Since all of the first terminals 131, the second terminals 132, the grounding terminals 133, 134 and the connecting terminals 135 protrude from the base 12 in the same direction, it is difficult and time-consuming for a user to connect each wire to the correct terminal. Furthermore, each wire is manually connected to a corresponding terminal by winding. The manual winding process is not only time-consuming, but may also result in detached wire if not done properly.

SUMMARY

Therefore, an object of the present disclosure is to provide an electronic device packaging box that can alleviate at least one of the drawbacks associated with the prior art.

According to the present disclosure, an electronic device packaging box is adapted to receive at least one electronic unit that includes a first coil and a second coil, and is adapted to electrically connect the electronic unit to a circuit board.

The electronic device packaging box includes a base and at least one terminal unit.

The base includes a first base wall, a second base wall, a separating wall, a first connecting wall, a second connecting wall, a first receiving space and a second receiving space. The second base wall is spaced apart from the first base wall in an up-down direction. The separating wall is disposed between the first base wall and the second base wall. The first connecting wall interconnects the first base wall and the separating wall. The second connecting wall interconnects the second base wall and the separating wall. The first receiving space is defined by the first base wall, the separating wall and the first connecting wall, has a first side opening, and is adapted to receive the first coil of the electronic unit. The second receiving space is defined by the separating wall, the second base wall and the second connecting wall, has a second side opening opposite to the first side opening, and is adapted to receive the second coil of the electronic unit. The first base wall has a first side surface that is proximate to the first side opening. The second base wall has a second side surface that is proximate to the second side opening. The separating wall has a third side surface that is proximate to the first side opening and a fourth side surface that is proximate to the second side opening.

The terminal unit is mounted on the base, is adapted to electrically connect the electronic unit to the circuit board, and includes two connecting terminals, two first terminals and two second terminals. Each of the connecting terminals has a first connecting section that protrudes from the second side surface and a second connecting section that protrudes from the third side surface. Each of the first terminals has a first wire connecting section that protrudes from the first side surface. Each of the second terminals has a second wire connecting section that protrudes from the fourth side surface.

BRIEF DESCRIPTION OF THE DRAWINGS

Other features and advantages of the present disclosure will become apparent in the following detailed description of the embodiment and variation with reference to the accompanying drawings, of which.

DETAILED DESCRIPTION

Figure 1:
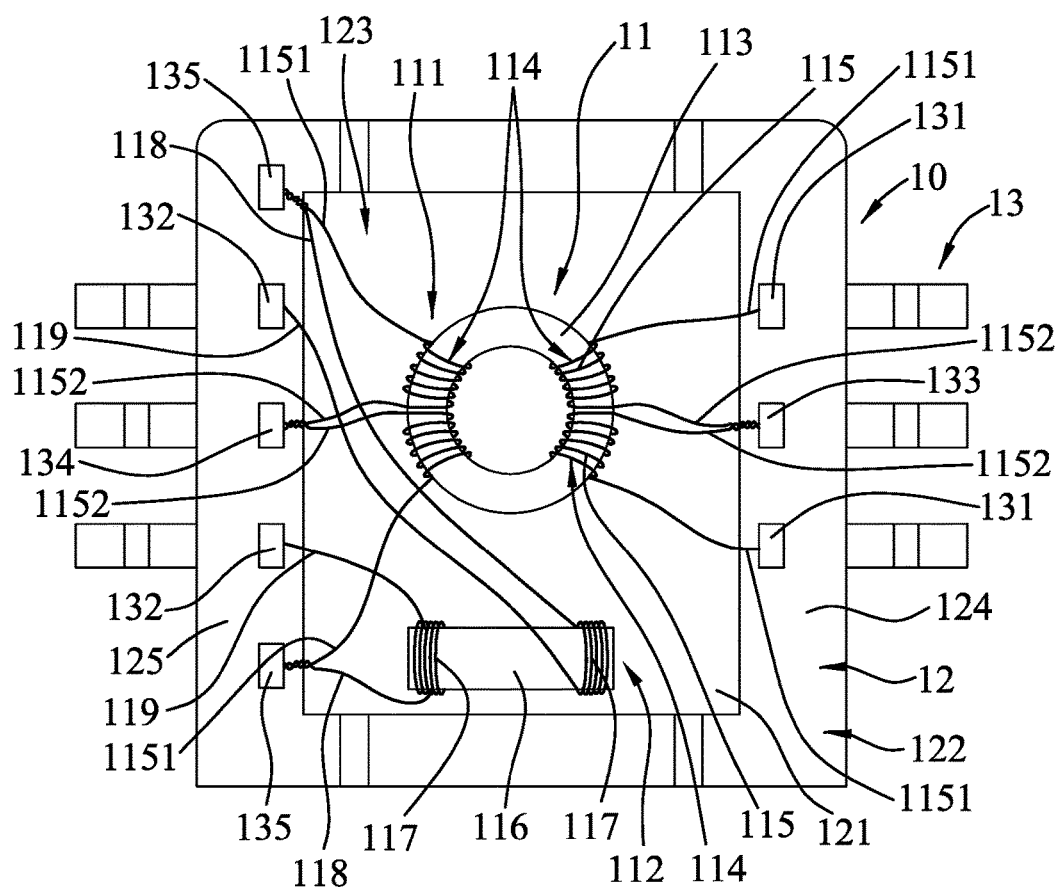
FIG. 1 is a top view of a conventional electronic apparatus.
Figure 2:
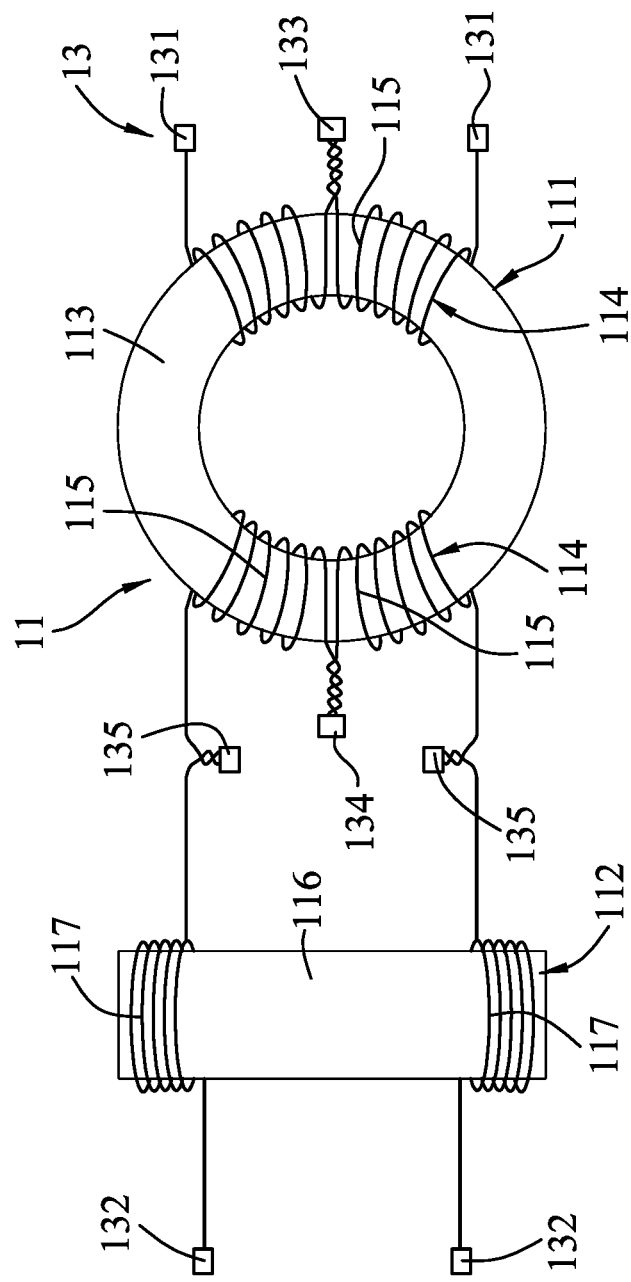
FIG. 2 is a schematic view showing the wiring of the conventional electronic apparatus.
Figure 3:
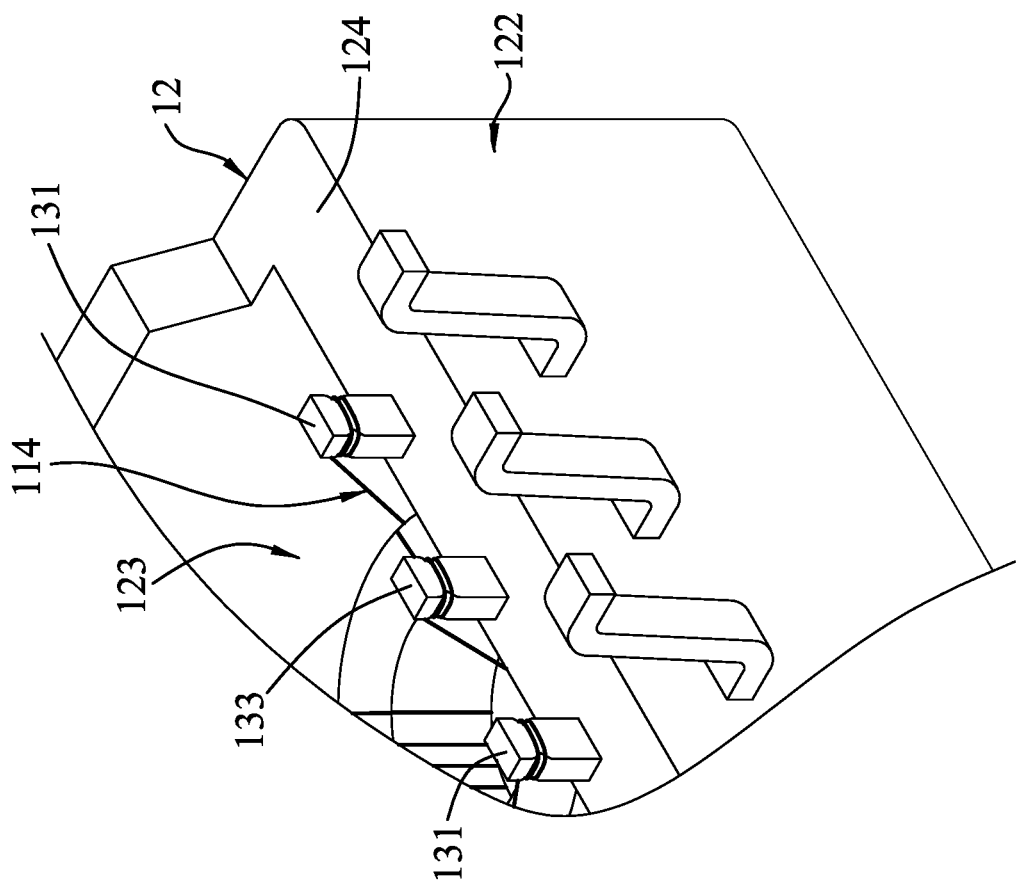
FIG. 3 is a schematic view showing the connection between a terminal unit and an electronic unit of the conventional electronic apparatus.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 4:
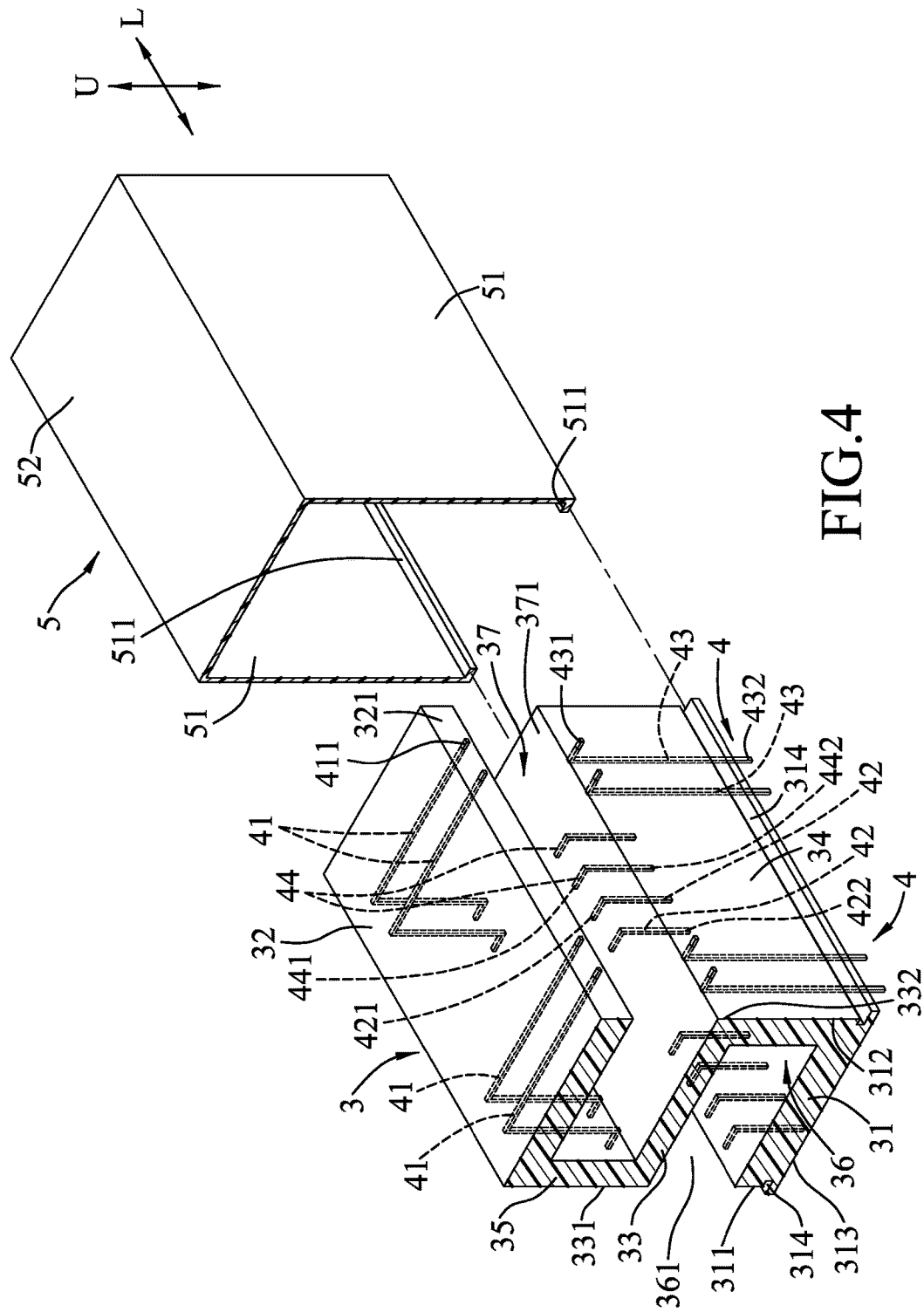
FIG. 4 is a schematic perspective view of an embodiment of an electronic device packaging box according to the present disclosure.
Figure 5:
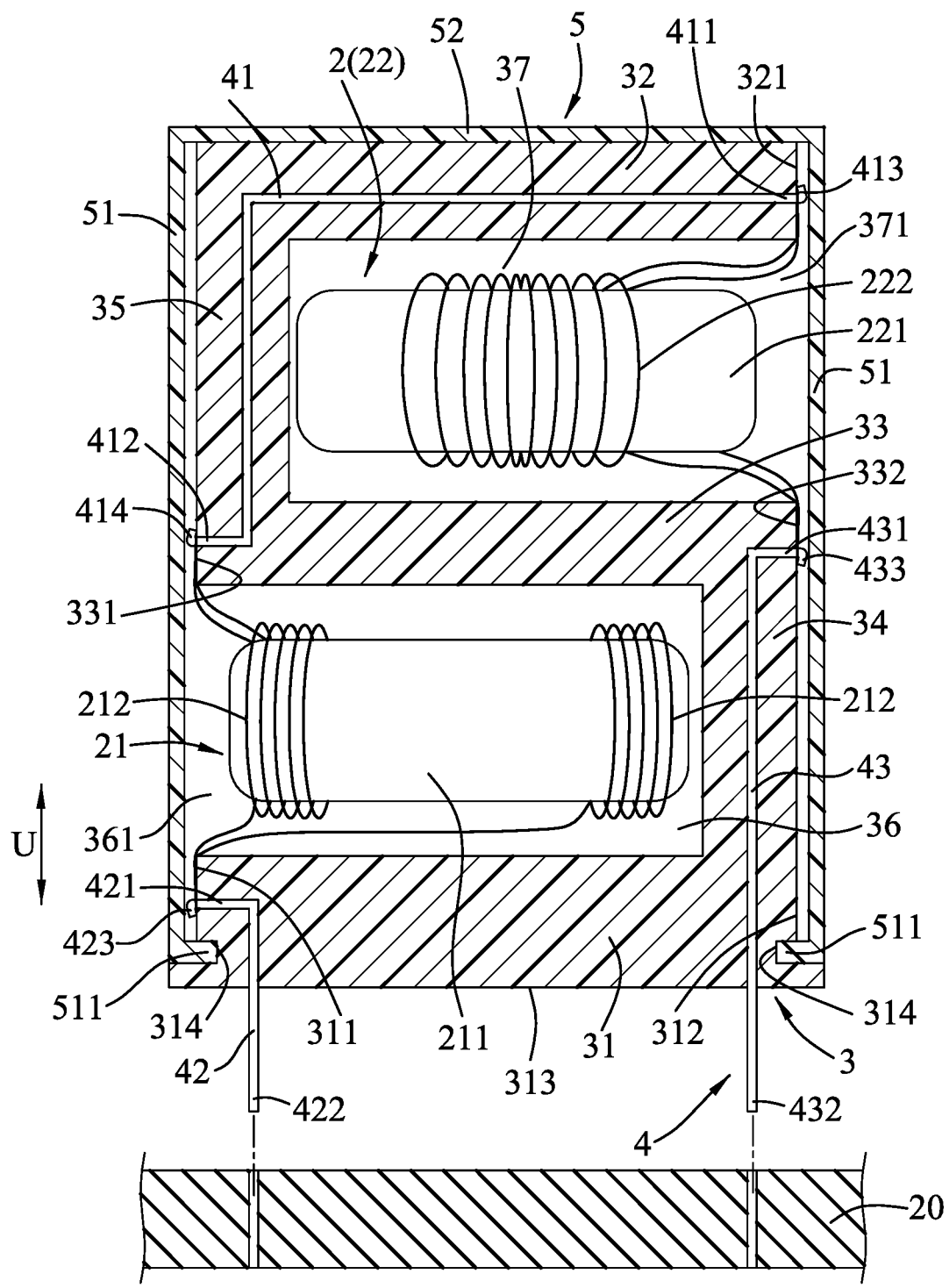
FIG. 5 is a partly sectional view of the embodiment.
Figure 6:
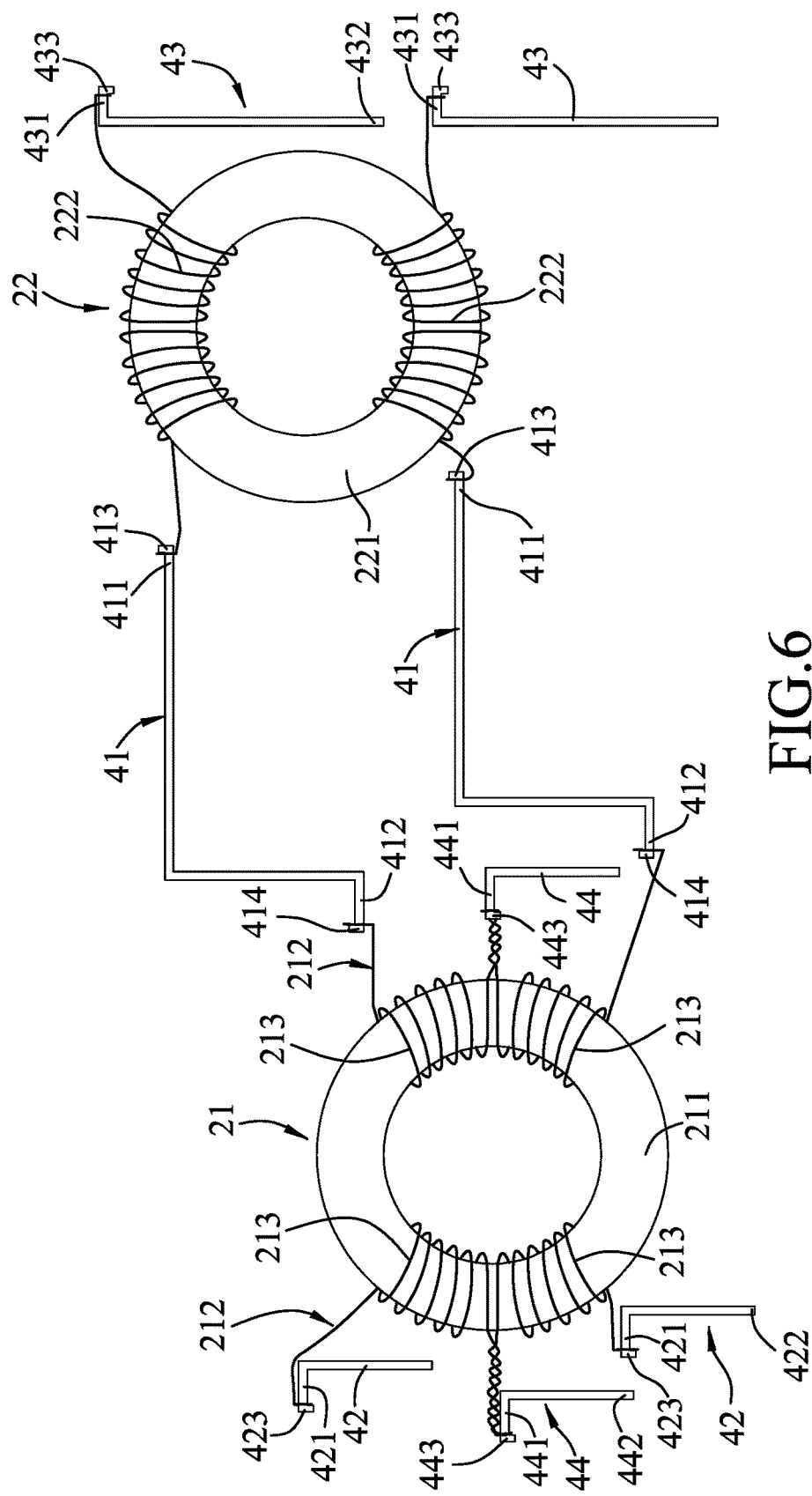
FIG. 6 is a schematic view showing electric connection of the embodiment.

Referring to FIGS. 4 to 6, an embodiment of an electronic device packaging box according to the present disclosure is a double in-line package (DIP) type packing box, is adapted to received at least one electronic unit 2, and is adapted to electrically connect the electronic unit 2 to a circuit board 20. In practical use, the number of the electronic unit 2 is usually more than one. However, only one electronic unit 2 is described hereinafter for the sake of brevity.

The electronic unit 2 includes a first coil 21 and a second coil 22. The first coil 21 includes a first core 211 and two first connecting wires 212 that are wound on the first core 211. Each of the first connecting wires 212 has two connecting wire sections 213. The second coil 22 includes a second core 221 and two second connecting sections 213 that are wound on the second core 221.

The electronic device packaging box includes a base 3, at least one terminal unit 4 and a case 5.

Similar to the electronic unit 2, in practical use, the number of the terminal unit 4 is usually more than one, and each terminal unit 4 is electrically connected to a corresponding electronic unit 2. Nonetheless, only one terminal unit 4 is described hereinafter for the sake of brevity.

Alternatively, in other designs, only one terminal unit 4 in practical use is enough to achieve the electrical connection requirements.

The base 3 includes a first base wall 31, a second base wall 32, a separating wall 33, a first connecting wall 34, a second connecting wall 35, a first receiving space 36 and a second receiving space 37. The first base wall 31 extends in a longitudinal direction (L). The second base wall 32 extends in the longitudinal direction (L), and is spaced apart from the first base wall 31 in an up-down direction (U). In this embodiment, the longitudinal direction (L) is perpendicular to the up-down direction (U). The separating wall 33 extends in the longitudinal direction (L), and is disposed between the first base wall 31 and the second base wall 32. The first connecting wall 34 interconnects the first base wall 31 and the separating wall 33. The second connecting wall 35 interconnects the second base wall 32 and the separating wall 33. The first receiving space 36 is defined by the first base wall 31, the separating wall 33 and the first connecting wall 34, has a first side opening 361, and is adapted to receive the first coil 21 of the electronic unit 2. The second receiving space 37 is defined by the separating wall 33, the second base wall 32 and the second connecting wall 35, has a second side opening 371 opposite to the first side opening 361, and is adapted to receive the second coil 22 of the electronic unit 2.

The first base wall 31 has a first side surface 311, an opposing surface 312, a protruding surface 313 and two engaging grooves 314. The first side surface 311 extends perpendicular to the circuit board 20 and is proximate to the first side opening 361. The opposing surface 312 extends parallel to and is opposite to the first side surface 311. The protruding surface 313 is connected between the first side surface 311 and the opposing surface 312, and is adapted to be parallel to and proximate to the circuit board 20. The engaging grooves 314 are respectively formed in the first side surface 311 and the opposing surface 312, and each extend in the longitudinal direction (L). The second base wall 32 has a second side surface 321 that is proximate to the second side opening 371, and that flushes with the opposing surface 312 of the first base wall 31. The separating wall 33 has a third side surface 331 that is proximate to the first side opening 361 and that flushes with the first side surface 311 of the first base wall 31, and a fourth side surface 332 that is proximate to the second side opening 371 and that flushes with the opposing surface 312 of the first base wall 31. In this embodiment, the first side surface 311 of the first base wall 31 and the third side surface 331 of the separating wall 33 are respectively located below and above the first side opening 361 of the first receiving space 36. The second side surface 321 of the second base wall 32 and the fourth side surface 332 of the separating wall 33 are respectively located above and below the second side opening 371 of the second receiving space 37.

The terminal unit 4 is mounted to the base 3, is adapted to electrically connect the electronic unit 2 to the circuit board 20, and includes two connecting terminals 41, two first terminals 42, two second terminals 43 and two grounding terminals 44. The connecting terminals 41 are spaced apart from each other in the longitudinal direction (L). Each of the connecting terminals 41 has a first connecting section 411 that protrudes from the second side surface 321 of the second base wall 32, and a second connecting section 412 that protrudes from the third side surface 331 of the separating wall 33. The first terminals 42 are spaced apart from each other in the longitudinal direction (L). Each of the first terminals 42 has a first wire connecting section 421 that protrudes from the first side surface 311 of the first base wall 31, and a first attaching section 422 that protrudes from the protruding surface 313 of the first base wall 31. The second terminals 43 are spaced apart from each other in the longitudinal direction (L). Each of the second terminals 43 has a second wire connecting section 431 that protrudes from the fourth side surface 332, and a second attaching section 432 that protrudes from the protruding surface 313. The grounding terminals 44 are spaced apart from each other and the first terminals 42 in the longitudinal direction (L). Each of the grounding terminals 44 has a first grounding section 441 that protrudes from the first side surface 331 of the first base wall 31, and a second grounding section 442 that protrudes from the protruding surface 313 of the first base wall 31.

The case 5 covers the base 3 such that access to the first side opening 361 and the second side opening 371 is prevented. In this embodiment, the case 5 has two side walls 51 that are spaced apart from each other, and a top wall 52 that is connected between top ends of the side walls 51. Each of the side walls 51 has an engaging member 511 that engages a respective one of the engaging grooves 314.

During the formation of the electronic device packaging box, the terminal unit 4 is embedded in the base 3 to obtain the above described structure.

In assembly, the first coil 21 of the electronic unit 2 is placed into the first receiving space 36 of the base 3.

Subsequently, one end of one of the first connecting wire sections 213 of one of the first connecting wires 212 is entwined with one end of the other one of the first connecting wire sections 213 of the one of the first connecting wires 212 and then connected to the first grounding section 441 of one of the grounding terminals 44. The other ends of the first connecting wire sections 213 of the one of the first connecting wires 212 are respectively connected to the first wire connecting sections 421 of the first terminals 42. Moreover, one end of one of the first connecting wire sections 213 of the other one of the first connecting wires 212 is entwined with one end of the other one of the first connecting wire sections 213 of the other one of the first connecting wires 212 and then connected to the first grounding section 441 of the other one of the grounding terminals 44. The other ends of the first connecting wire sections 213 of the other one of the first connecting wires 212 are respectively connected to the second connecting sections 412 of the connecting terminals 41.

In addition, in installing the second coil 22 to the electronic device packaging box, the second coil 22 is placed into the second receiving space 37 of the base 3. One end of each second connecting wire 222 is connected to a respective one of the first connecting sections 411 of the connecting terminals 41. The other end of each second connecting wire 222 is connected to a respective one of the second wire connecting sections 431 of the second terminals 43.

Figure 7:
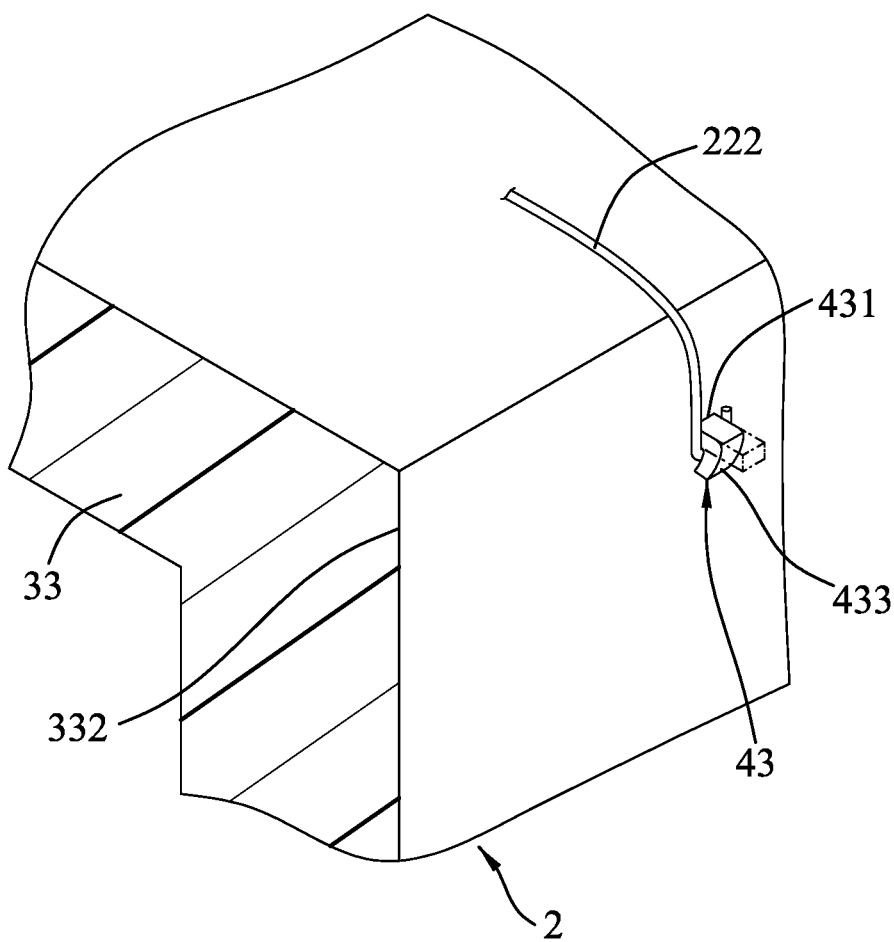
FIG. 7 is a schematic view of the embodiment showing the formation of a clamping portion for wire connection.

Referring to FIGS. 4 to 7, in order to enhance connection between the terminal unit 4 and the electronic unit 2 and to improve manufacturing speed, the terminal unit 4 is pressed multiple times such that each of the first connecting section 411 and the second connecting section 412 of each of the connecting terminals 41, the first wire connecting section 421 and the first attaching section 422 of each of the first terminals 42, the second wire connecting section 431 and the second attaching section 432 of each of the second terminals 43, and the first grounding section 441 of each of the grounding terminals 44 has a pressed clamping portion 413, 414, 423, 433, 443 that is bent and that is adapted to clamp and hold at least one of the first connecting wires 212 and the second connecting wires 222 of the electronic unit 2 on the base 3. For example, as shown in FIG. 7, an end of one of the second connecting wires 222 circles the respective second wire connecting section 431, followed by pressing the respective second wire connecting section 431 to form the clamping portion 433, so as to firmly connect the end of the one of the second connecting wires 222 to the respective second wire connecting section 431.

Figure 8:
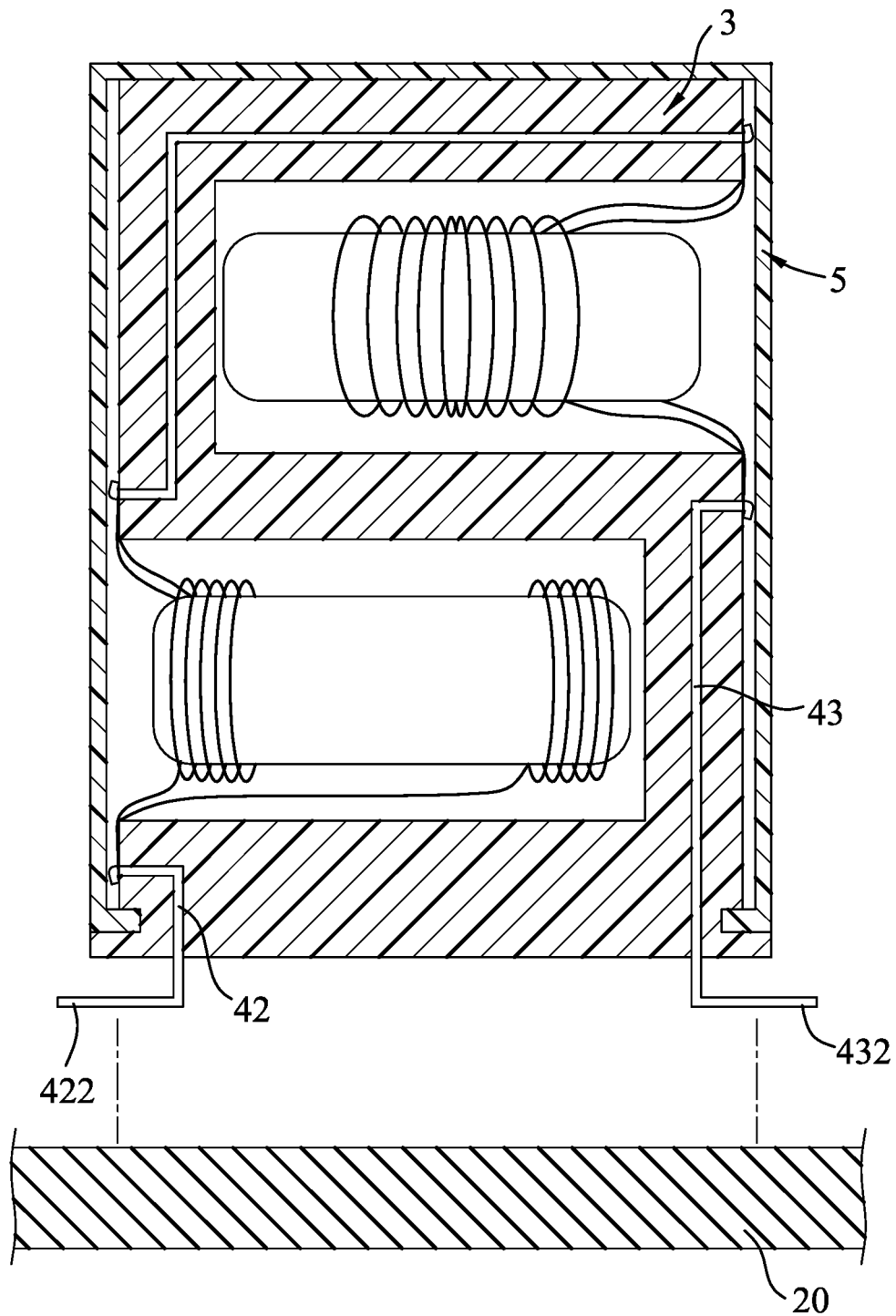
FIG. 8 is a partly sectional view of a variation of the embodiment.

Referring to FIG. 8, a variation of the embodiment of the electronic device packaging box according to the present disclosure has a structure modified base on the embodiment. In the variation, the electronic device packaging box is a surface mounted device (SMD) type packing box, in which the first attaching section 422 of each of the first terminals 42, the second attaching section 432 of each of the second terminals 43 and the second grounding section 442 of each of the grounding terminals 44 (not shown) extend parallel to the circuit board 20.

To sum up, according to the present disclosure, the first receiving space 36 and the second receiving space 37 are spaced apart in the up-down direction (U). Moreover, the first side opening 361 of the first receiving space 36 and the second side opening 371 of the second receiving space 37 are opened away from each other. In addition, the second connecting section 412 of each of the connecting terminals 41 is disposed at one side of the first side opening 361 and is proximate to the first side opening 361, and the first wire connecting section 421 of each of the first terminals 42 and the first grounding section 441 of each of the grounding terminals 44 are disposed at an opposite side of the first side opening 361 and are proximate to the first side opening 361. Furthermore, the first connecting section 411 of each of the connecting terminals 41 is disposed at one side of the second side opening 371 and is proximate to the second side opening 371, and the second wire connecting section 431 of each of the second terminals 43 is disposed at an opposite side of the second side opening 371 and is proximate to the second side opening 371. With the above described structure, it is rather easy and convenient to connect the first connecting wires 212 of the first coil 21 and the second connecting wires 222 of the second coil 22 to the connecting terminals 41, first terminals 42, second terminals 43 and the grounding terminals 44 of the terminal unit 4 in a correct and desirable manner. Moreover, with the formation of the pressed clamping portions 413, 414, 423, 433, manufacturing speed and reliability of the electronic device packaging box of this disclosure is improved.

In the description above, for the purposes of explanation, numerous specific details have been set forth in order to provide a thorough understanding of the embodiment and variation. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiment and variation, it is understood that this disclosure is not limited to the disclosed embodiment and variation but is intended to cover various arrangements included within the spirit and scope of the broadest interpretation so as to encompass all such modifications and equivalent arrangements.

What is claimed is:

1. An electronic device packaging box adapted to receive at least one electronic unit that includes a first coil and a second coil, and adapted to electrically connect the electronic unit to a circuit board, said electronic device packaging box comprising:
    a base including
        a first base wall,
        a second base wall that is spaced apart from said first base wall in an up-down direction,
        a separating wall that is disposed between said first base wall and said second base wall,
        a first connecting wall that interconnects said first base wall and said separating wall,
        a second connecting wall that interconnects said second base wall and said separating wall,
        a first receiving space that is defined by said first base wall, said separating wall and said first connecting wall, that has a first side opening, and that is adapted to receive the first coil of the electronic unit, and
        a second receiving space that is defined by said separating wall, said second base wall and said second connecting wall, that has a second side opening opposite to said first side opening, and that is adapted to receive the second coil of the electronic unit, said first base wall having a first side surface that is proximate to said first side opening, said second base wall having a second side surface that is proximate to said second side opening, said separating wall having a third side surface that is proximate to said first side opening and a fourth side surface that is proximate to said second side opening;

at least one terminal unit mounted on said base, adapted to electrically connect the electronic unit to the circuit board, and including two connecting terminals, two first terminals and two second terminals, each of said connecting terminals having a first connecting section that protrudes from said second side surface and a second connecting section that protrudes from said third side surface, each of said first terminals having a first wire connecting section that protrudes from said first side surface, each of said second terminals having a second wire connecting section that protrudes from said fourth side surface.

2. The electronic device packaging box as claimed in claim 1, wherein:

said first side surface of said first base wall and said third side surface of said separating wall are respectively located below and above said first side opening of said first receiving space; and said second side surface of said second base wall and said fourth side surface of said separating wall are respectively located above and below said second side opening of said second receiving space.

3. The electronic device packaging box as claimed in claim 2, wherein:

said first base wall of said base further has an opposing surface that is opposite to said first side surface, and a protruding surface that is connected between said first side surface and said opposing surface and that is adapted to be proximate to the circuit board;

each of said first terminals further has a first attaching section that protrudes from said protruding surface; and each of said second terminals further has a second attaching section that protrudes from said protruding surface.

4. The electronic device packaging box as claimed in claim 3, wherein:

said terminal unit further includes two grounding terminals; and each of said grounding terminals has a first grounding section that protrudes from said first side surface of said first base wall, and a second grounding section that protrudes from said protruding surface of said first base wall.

5. The electronic device packaging box as claimed in claim 4, wherein each of said first connecting section and said second connecting section of each of said connecting terminals, said first wire connecting section and said first attaching section of each of said first terminals, said second wire connecting section and said second attaching section of each of said second terminals, and said first grounding section of each of said grounding terminals has a clamping portion that is adapted to clamp and hold at least one of the first connecting wires and the second connecting wires of the electronic unit on said base.

6. The electronic device packaging box as claimed in claim 2, further comprising a case that covers said base such that access to said first side opening and said second side opening is prevented.

7. The electronic device packaging box as claimed in claim 6, wherein:

said first base wall of said base further has an opposing surface that is opposite to said first side surface, and two engaging grooves that are respectively formed in said first side surface and said opposing surface;

said case has two side walls that are spaced apart from each other, and a top wall that is connected between top ends of said side walls; and each of said side walls has an engaging member that engages a respective one of said engaging grooves.

8. The electronic device packaging box as claimed in claim 1, wherein each of said first connecting section and said second connecting section of each of said connecting terminals, said first wire connecting section and said first attaching section of each of said first terminals, and said second wire connecting section and said second attaching section of each of said second terminals has a pressed clamping portion that is adapted to clamp and hold at least one of the first connecting wires and the second connecting wires of the electronic unit on said base.

* * * * *